United States Patent [19]
Tran

[11] Patent Number: 5,618,348
[45] Date of Patent: Apr. 8, 1997

[54] AIR ELIMINATION SYSTEM

[75] Inventor: Chuong R. Tran, San Jose, Calif.

[73] Assignee: Dainippon Screen Mfg. Co., Ltd., Japan

[21] Appl. No.: 379,886

[22] Filed: Jan. 27, 1995

[51] Int. Cl.$^6$ .................................................. B05C 11/10
[52] U.S. Cl. .......................... 118/693; 118/694; 222/431; 239/350
[58] Field of Search ..................... 118/693, 688, 118/689, 690, 694; 239/569–572, 340, 349, 350; 222/61, 56, 630, 424.5, 431, 432, 283, 372, 373; 137/171, 179, 180, 386, 395, 583, 587, 625.2; 141/44; 427/96

[56] References Cited

U.S. PATENT DOCUMENTS 5,316,181  5/1994  Burch .................................... 222/144.5

Primary Examiner—Donald E. Czaja
Assistant Examiner—Calvin Padgett
Attorney, Agent, or Firm—Ostrolenk, Faber, Gerb & Soffen, LLP

[57] ABSTRACT

A system for eliminating air from liquid-carrying conduits, in particular in a photoresist dispensing system, with features for reducing the possibility of contamination by residual resist in the conduits after the air elimination process has been carried out. Double or multiple tubing, with one or more secondary tubes contained within an outer tube, is used to interconnect the trap tank, the drain and the vacuum chamber. Resist is directed through the double or multiple tubing such that resist is completely evacuated from the vacuum chamber, and from the trap tank, to the drain valve. Further, an arrangement for avoiding the consequences of contamination of the air exhaust valve in the system, if a mist of residual resist has not been removed by the air elimination process, includes a vacuum generator downstream from the air exhaust valve. The vacuum from the vacuum generator is applied as a negative pressure downstream from the valve rather than a positive pressure upstream from the valve, thus reducing the possibility of air or contamination being forced backwards through the system by a blockage of the air exhaust valve.

13 Claims, 8 Drawing Sheets

AIR ELIMINATION SYSTEM

BACKGROUND OF THE INVENTION

1. Field of the Invention

The present invention relates to a system for eliminating air from liquid-carrying conduits, in particular in a photoresist dispensing system. It relates more particularly to an air eliminating system in which there is a reduced possibility of contamination by residual resist in the conduits after the air elimination process has been carried out, as well as other improvements.

2. Background Art

Photoresist dispensing systems are employed to supply photoresist to equipment which utilizes a photographic process for manufacturing integrated circuits. A common problem in such systems is how to handle excess air, nitrogen, or other gas which either outgasses from the photoresist or is introduced into the system in another way, such as when changing bottles. Microscopic gas bubbles can block key filter elements or cause foaming of the resist as it is pumped through the system, impairing the quality of the dispensed resist. Larger quantities of gas can totally interrupt the flow of the resist. In either case, lengthy manual procedures are needed to clear excess gas from the system, and these procedures are not always successful.

A known photoresist dispensing system is the PDS-1000 manufactured by the Iwaki Walchem Corporation in Holliston, Mass., which includes a PDS-1300 automatic air elimination module, shown in FIG. 1. The Iwaki system attempts to solve some of these problems by automatically changing bottles and performing some gas elimination steps, but leaves other problems unsolved.

As shown in FIG. 1, if the Iwaki system comprises a pair of resist bottles B1 and B2 connected to a trap tank T via a normally open valve BV1 and a normally closed valve BV2, respectively. The trap tank holds approximately a 10-minute supply of resist and supplies the resist via a pump P to a spin unit SU which is part of an integrated circuit manufacturing system.

When the first bottle B1 becomes empty, the resist level in the trap tank drops and air enters the trap tank. A sensor S2 turns off, in response to the absence of resist, indicating that there is now air at the top of the trap tank, and issues a signal which causes the valve BV1 to close and the valve BV2 to open, and withdrawal of resist begins from the second bottle B2. Air can enter the system both from the empty bottle B1 and its feed lines, and from the empty feed lines that run to the bottle B2.

A sensor S3 is provided for detecting when the resist level has reached the bottom of the trap tank in order to initiate an emergency shutdown procedure. To attempt to eliminate the excess air which has entered the system from the bottles and their associated conduits, as well as any gasses which have outgassed from the resist, an air elimination cycle then begins. A normally closed air-operated valve AV4 is opened, to permit excess air and photoresist to be drawn from the trap tank. The valve AV4 is located directly at the top of the trap tank. A vacuum generator V, which will generate vacuum to drive the air elimination cycle, receives pressurized air from a utility air line controlled by a solenoid valve SV5. (Hereinafter the abbreviations AV and SV indicate an air-actuated valve and a solenoid-actuated valve, respectively.) The vacuum generator includes a conventional combination of a check valve and a needle valve to form a speed controller SC. Vacuum is generated by an injector having a Venturi with a 1.0-mm orifice, which creates a vacuum in a vacuum chamber to draw the excess air and resist through a vacuum line VL from the trap tank via the valve AV4. The pressurized air is exhausted from the vacuum generator via a normally closed valve AV1 which has been opened for this purpose. The presence of positive and negative air pressure at the various points in the vacuum generator V is indicated by circled plus-signs and minus-signs in the figures.

In the air elimination cycle, which attempts to eliminate excess gas from the trap tank and from the lines between the new bottle B2 and the trap tank, excess gas and resist are drawn by the vacuum into the line VL. When a sensor S1 at the vacuum chamber detects the new photoresist which has been drawn from the second bottle B2, the air eliminator cycle is ended by closing valve AV1 to turn off the vacuum generator, and by closing valve AV4. The line VL, and the conduit C are then full of resist, whereby excess air and gas have been eliminated.

During the foregoing air elimination sequence, a normally open drain valve AV3 is kept closed. The drain valve AV3 is also closed during normal operation. It is opened only during the drainage cycle to be described below.

After the air elimination sequence, a drainage sequence is performed to rid the system of excess resist. The valve AV3 is opened and pressurized air is admitted from the utility air line via valve SV5. No vacuum is generated because valve AV1 is closed. Instead, the air pressurizes the vacuum chamber and pushes the resist back through the line VL, the drain line DL and the valve AV3 and into the drain.

The Iwaki system also has a valve AV2 which is connected at one end to the input of the drain valve AV3 but has no outlet connection and no designated function.

Table 1 illustrates the foregoing steps in more detail. Step 1 represents the normal operation of the resist supply, which is accordingly referred to as the "standby mode" of the air elimination module. During step 1, the Iwaki system supplies air to valve AV1 to maintain it open. This feature of the Iwaki system is undesirable. Valve AV1 should not be kept open because that creates the possibility of vacuum being inadvertently generated at an inappropriate time, or of pressurized gas being admitted into the module from an exhaust manifold downstream from the valve AV1.

Further, in step 1, air pressure is supplied continuously to valve AV3 to keep it closed, which is necessary because valve AV3 is a normally open valve in the Iwaki system.

At step 2, sensor S2 has turned off, indicating the detection of air at the top of the trap tank T. The air injector valve SV5 is turned on to admit air to the vacuum generator; the trap tank valve AV4 is also turned on; and the air elimination cycle is begun in order to eliminate the air that has been detected. The signal from sensor S2 also initiates the switchover from bottle B1 to bottle B2. However, the bottles are not switched if the S2 signal does not continue for a time T2 (here, 30 seconds), to prevent the switchover of the bottles from being initiated by the detection of a small quantity of air, when the first bottle is not in fact empty.

The remaining steps in Table 1 have been described previously or are self-explanatory in view of the comments in the table.

The Iwaki PDS-1000 system is incorporated by reference as known prior art. It has several important defects. After the drainage cycle, in which pressurized air from the utility air line has been utilized to force the resist out of the vacuum chamber and back to the drain through the vacuum line VL, the drain line DL, and the valve AV3, resist may still remain in the conduit section C, which extends approximately 8 to 10 inches (20 to 25 cm) from the valve AV4 to the junction of the drain line DL and the line VL, and/or in other lines. This remaining resist can bubble during the next vacuum cycle and create a mist which will clog the valve AV1 so as to prevent it from opening fully, reducing the vacuum generated and thereby interfering with or slowing down the vacuum cycle. If the air elimination sequence is not completed within a fixed time, because of clogging or another malfunction in the Iwaki system, the system automatically shuts down and must be manually restarted.

Further, if valve AV1 does become clogged and the pressure on its input side is high enough, air can be forced into the top of the vacuum chamber, causing a backflow of air, back through the trap tank T and into the source bottle B2. Such an occurrence can completely drain the Iwaki system of all resist.

In a busy Iwaki installation it is common for the valve AV1 to clog almost daily, requiring the system to be shut down so that the valve AV1 can be cleaned with a solvent or detergent. Clogging of the valve AV1 is a significant problem which increases downtime, reduces production, and substantially impairs the usefulness of the entire photoresist dispensing system.

A further defect in the Iwaki system is a result of the valve AV3 being normally open. It is only closed when the air elimination module of FIG. 1 is in its standby mode, i.e., during normal resist-supplying operation of the system. In a normal installation, a plurality of air elimination modules are usually interfaced to a common drain manifold. If power to the drain valve AV3 in a first module happens to be lost, that valve AV3 will open. If a drainage cycle then happens to be under way in another module, resist and/or air from the drain valve AV3 of the second module will back up into the inadvertently open valve AV3 in the first module. This sequence of events requires the first module to be shut down for either manual cleaning or activation of the air elimination and drainage sequences.

Another disadvantage of the Iwaki system is the use of a large 1.0 mm orifice in the vacuum generator. The large 1.0 mm orifice in the Venturi provided by Iwaki can cause an excessive pressure drop on a typical main air line, even though the air line complies with the specifications of the Iwaki system. Such pressure drop can cause all the valves to malfunction.

SUMMARY OF THE INVENTION

It is accordingly a general advantage of the present invention to provide a photoresist dispensing system which avoids the disadvantages of the Iwaki system.

A further advantage is to prevent or reduce the possibility of contamination of the Iwaki system by the excess resist which is often known to remain in the Iwaki system after the air elimination cycle.

Another advantage is to reduce the possible effects of contamination of the air exhaust valve AV1 in the Iwaki system, for example by the mist of residual resist which the air elimination cycle of the Iwaki system has failed to remove.

Yet another advantage is to reduce the possibility of the drain valve AV3 inadvertently opening and admitting waste air and/or resist from a drain manifold.

A further advantage is to avoid an undesirable drop in pressure on the main air line which feeds the air valves in the Iwaki system.

These and other objects may be accomplished by the invention disclosed and claimed herein.

According to a first aspect of the invention, a second vacuum generator is added to the known system downstream from the valve AV1. The original vacuum generator in the Iwaki system is not used during the air elimination sequence. The positive pressure from the original utility air line is only used during the drainage sequence. The vacuum from the second vacuum generator is applied as a negative pressure downstream from valve AV1 rather than a positive pressure upstream from valve AV1, as will be described hereinbelow. Thus, there is no longer any possibility of air being forced into the vacuum chamber, causing a reverse flow of resist and air back through the trap tank and into the source bottle, even if the valve AV1 were to become clogged. Positive pressure has been eliminated from the air elimination system.

According to a second aspect of the invention, double or multiple tubing, wherein one or more secondary tubes are contained within an outer tube, is used to interconnect the trap tank, the drain and the vacuum chamber. Resist is directed through the double or multiple tubing such that resist is completely evacuated from the vacuum chamber and from the trap tank to the drain valve. When the next air elimination cycle begins, no residual resist is left in the lines to bubble and create mist.

According to a third aspect of the invention, the drain valve AV3 is replaced by a normally closed valve AV3' which only opens during the drainage sequence. Valve AV3' is kept closed during the air elimination cycle, because otherwise the suction from the line VL might draw waste material from the drain manifold. Thus an inadvertent power loss can no longer cause the drain valve to open and allow backflow of resist and/or air from another module via a common drain manifold.

A fourth aspect of the invention is the use of a 0.5 mm orifice in the vacuum generator, as opposed to the 1 mm orifice used in the Iwaki system. The use of a 0.5 mm orifice has been found to cause less pressure drop on a main line which provides pressurized air according to the specifications of the Iwaki system. Further, air is pulled out of the system more slowly, which is advantageous because it results in less pulling of any photoresist mist which may be present.

Other features and advantages of the present invention will become apparent from the following description of the invention which refers to the accompanying drawings.

DETAILED DESCRIPTION OF EMBODIMENTS OF THE INVENTION

Figure 1:
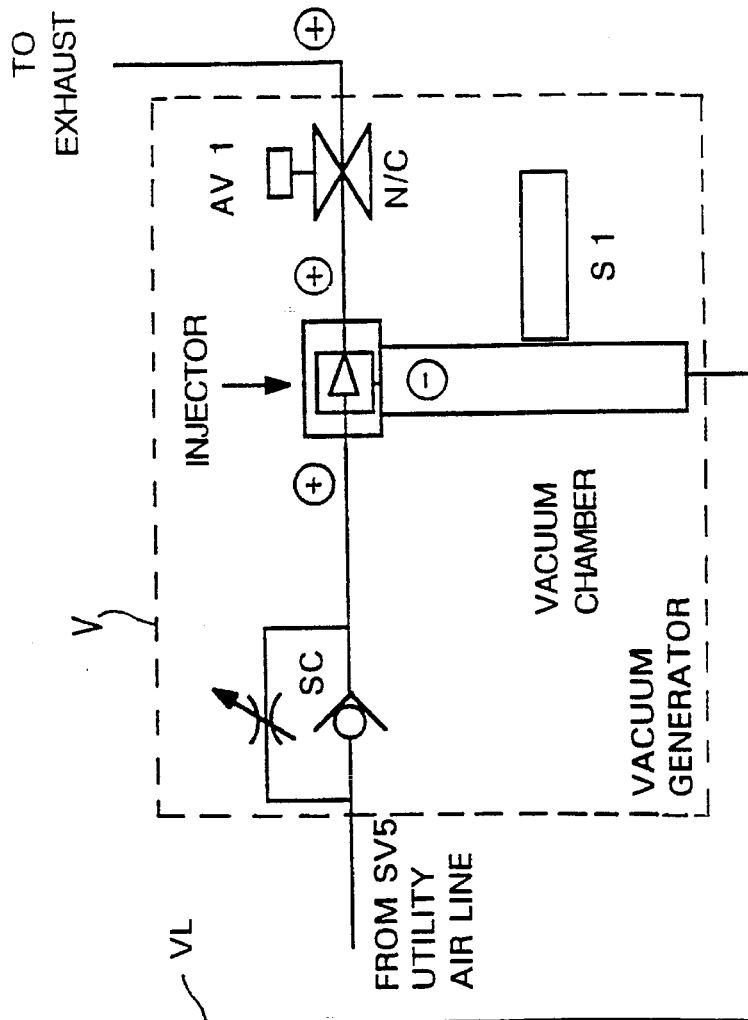
FIG. 1 is a schematic diagram of the prior art Iwaki PDS-1300 air elimination module.
Figure 1:
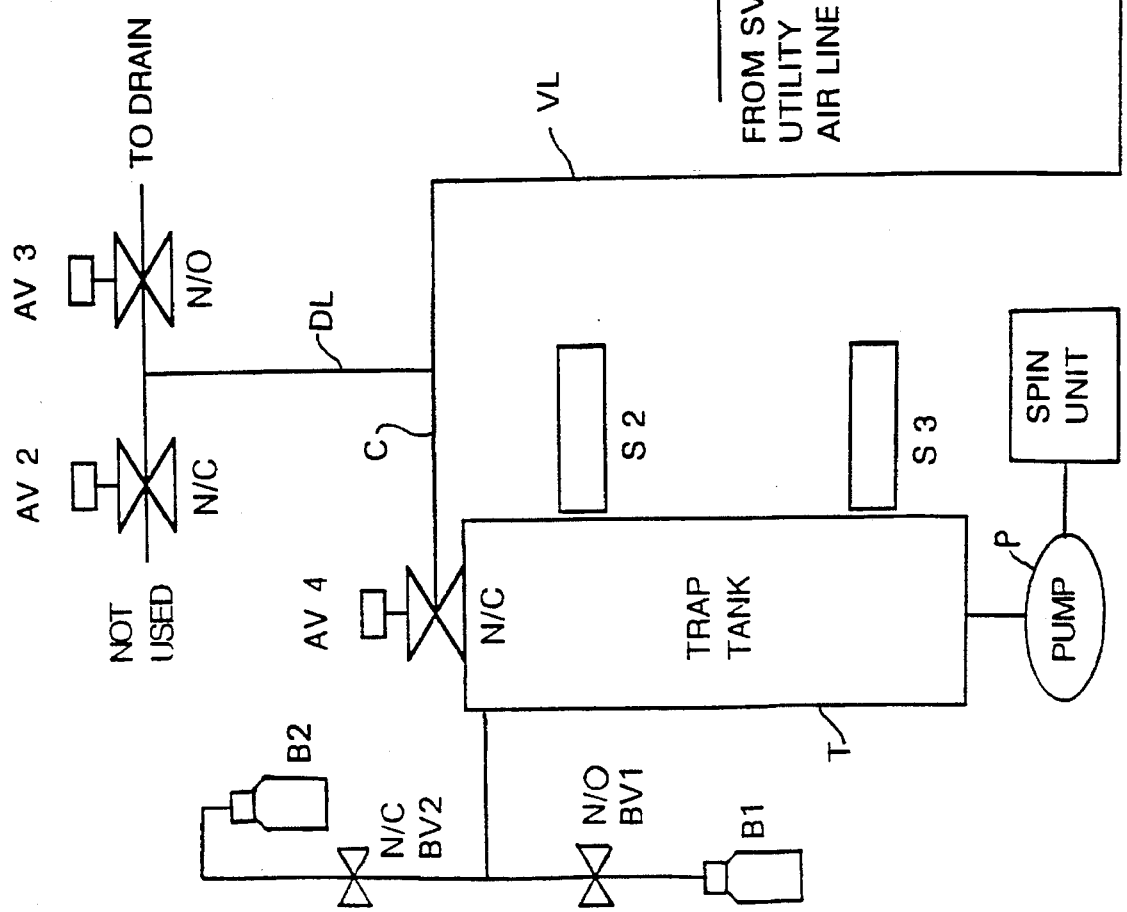
Figure 2:
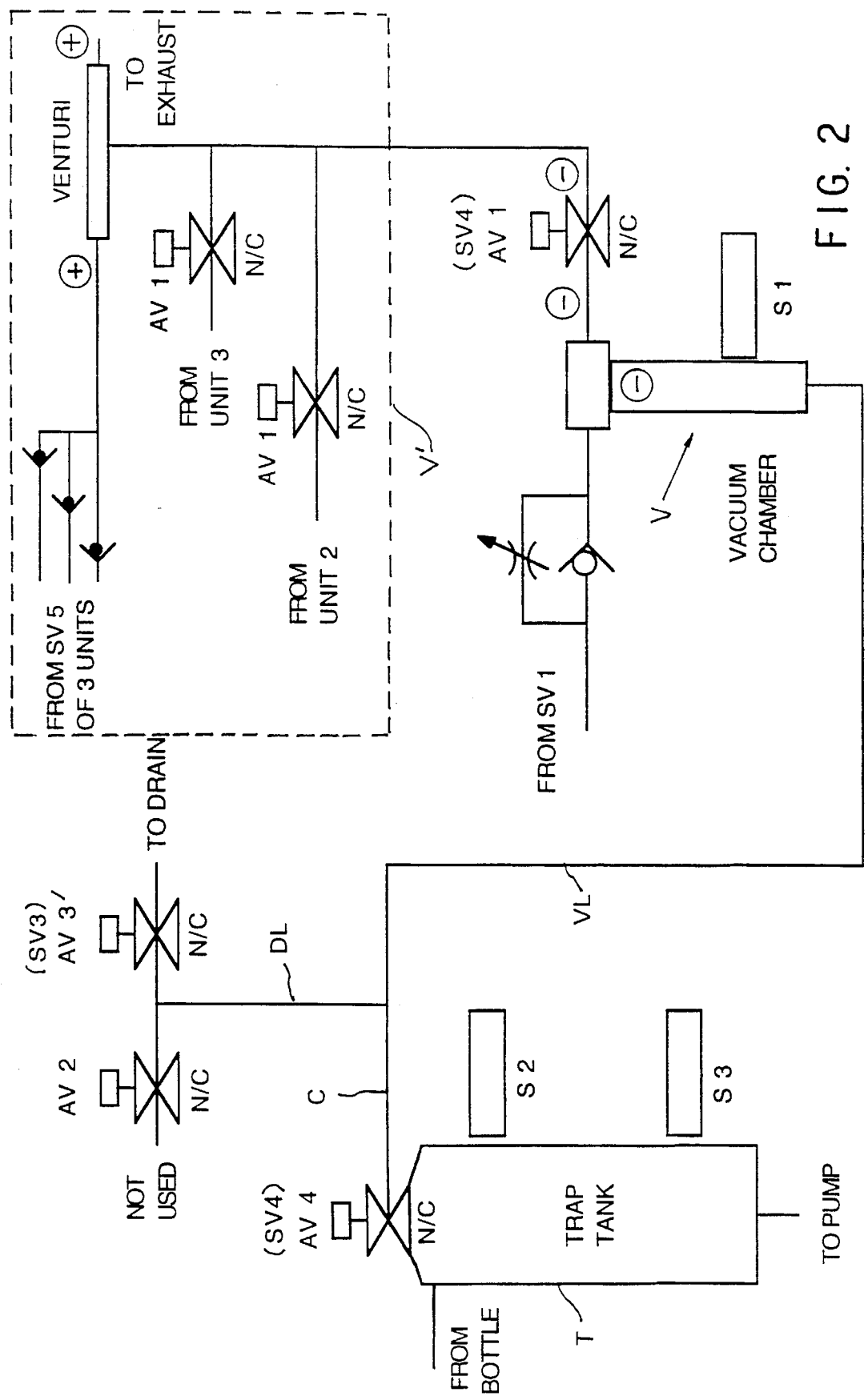
FIG. 2 is a schematic diagram showing an improved air elimination module according to an embodiment of the invention.

A preferred embodiment of the invention is shown in FIG. 2. Parts identical to those in FIG. 1 have been given identical reference designations, and their description has been omitted as unnecessary.

Although various valves are designated in FIG. 2 as air-actuated valves AV, as in the Iwaki system, it may be desirable for efficiency or economy to substitute solenoid-actuated valves. For example, in the present embodiment, both valves AV4 and AV1 are operated by a common solenoid valve SV4 (as indicated in parentheses in FIG. 2), because advantageously, the two valves are always in the same state. This is an improvement over the Iwaki system, in which the valve AV1 is open during normal operation of the resist supply, which leads to the disadvantages mentioned above. It is also desirable for the drain valve AV3' to by operated by a solenoid valve SV3.

A solenoid valve SV1 controls the feed of pressurized air to the original vacuum generator V. As mentioned above, the original vacuum generator V is used in this embodiment only for driving the drainage cycle.

The valves SV5 from the prior art system are used in this embodiment to feed pressurized air to the second vacuum generator V'. Further, several valves SV5 from different air elimination modules, three in this example, may be tied to the vacuum generator V' in parallel, and correspondingly, three valves AV1 from the respective modules may be supplied in parallel with vacuum from the vacuum generator V'.

Thus, in this embodiment of the invention, only negative pressure is present at the exhaust valve AV1 during the air elimination cycle. Even if valve AV1 should become clogged, pressurized air will not be forced into the vacuum chamber and back up into the vacuum line VL as in the prior art Iwaki system.

As described above, in this embodiment of the invention, the drain valve AV3' is normally closed rather than normally open as in the Iwaki system. Thus, the drain valve is no longer subject to inadvertently opening, with undesirable results, if power to the drain valve is lost.

The modified sequence of operations is described in Table 2, which again is self-explanatory in view of the comments in the table and the discussion hereinabove.

Figure 3:
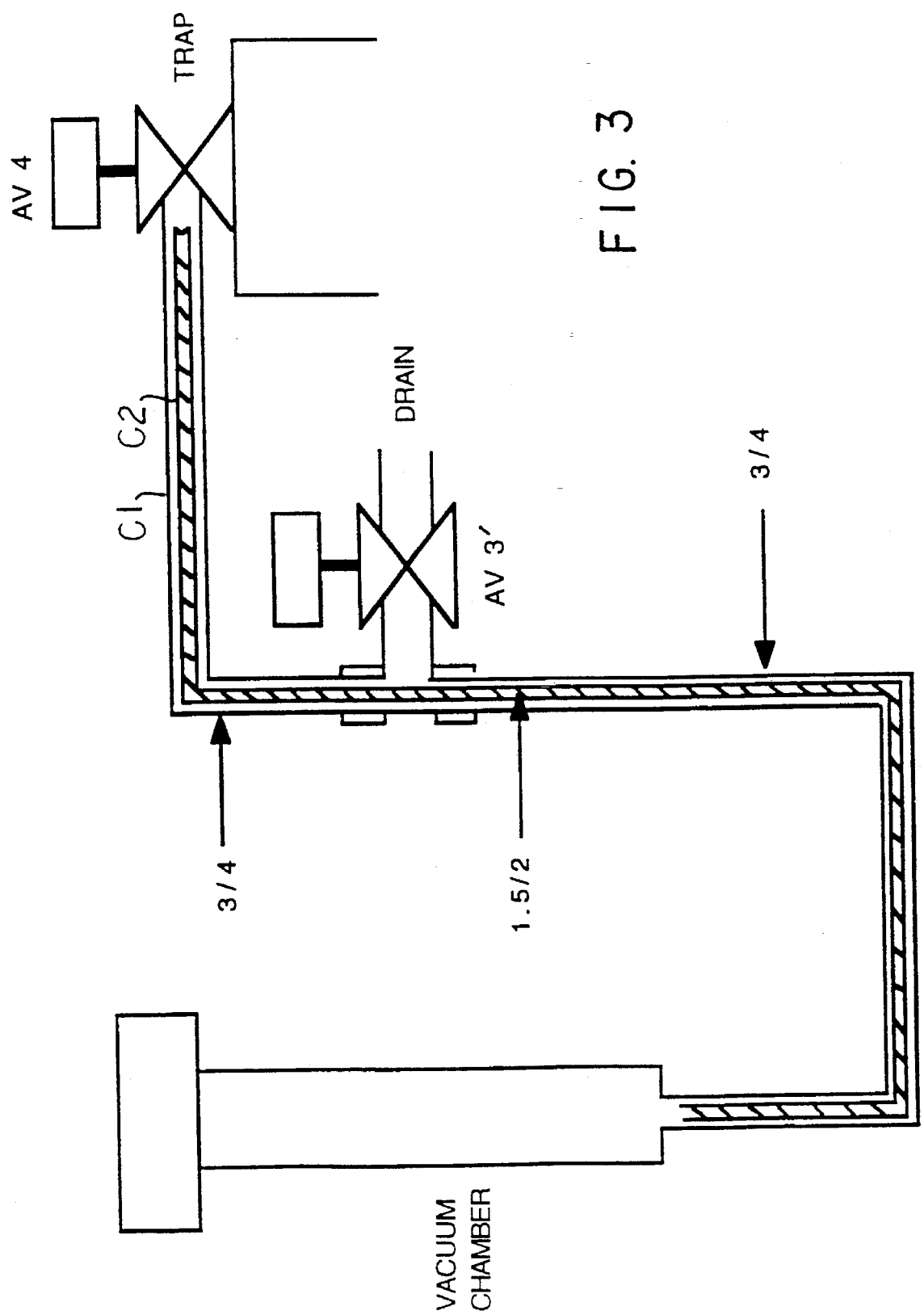
FIGS. 3–5 show a modified conduit arrangement which may be used in the FIG. 2 system.
Figure 4:
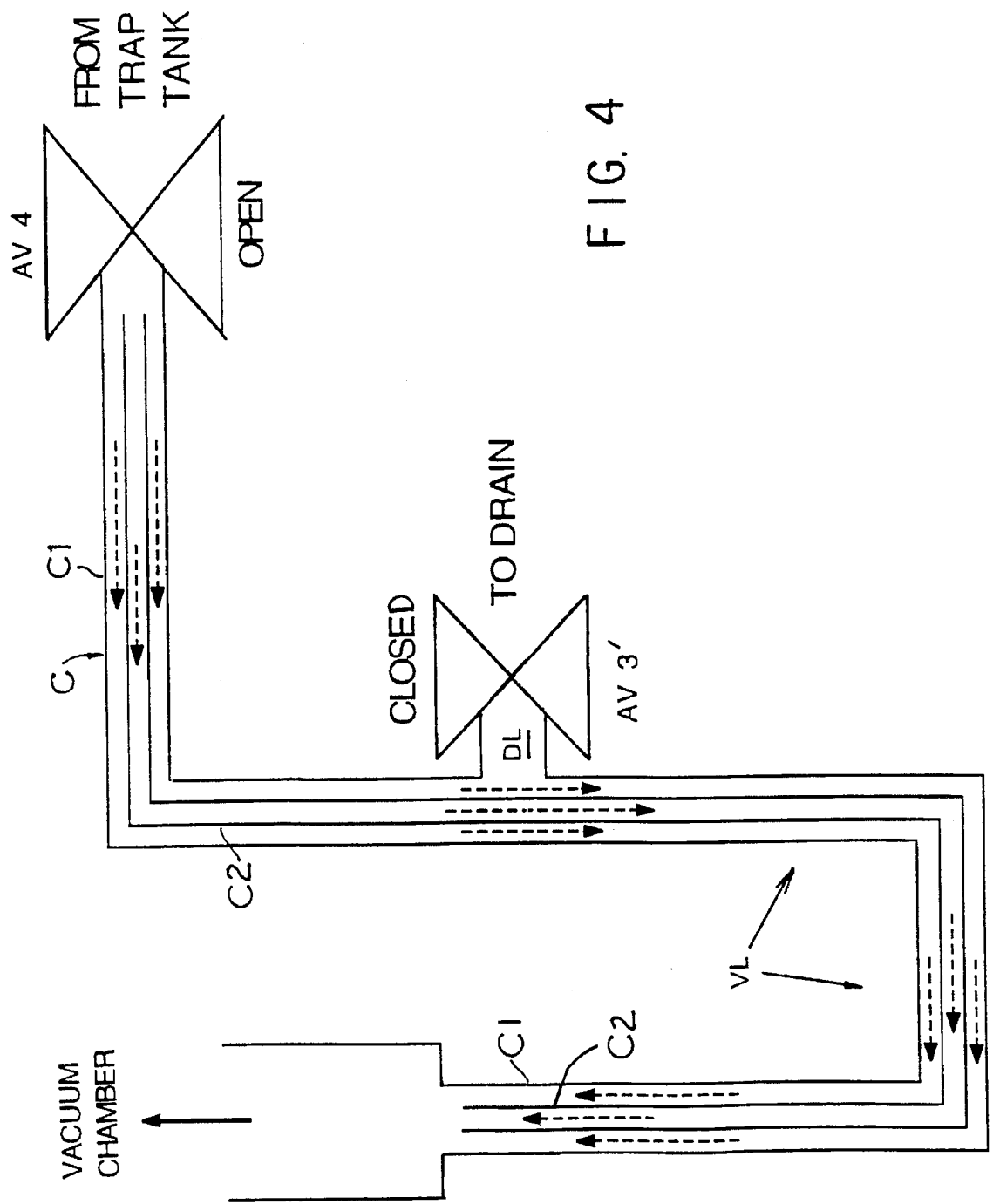
Figure 5:
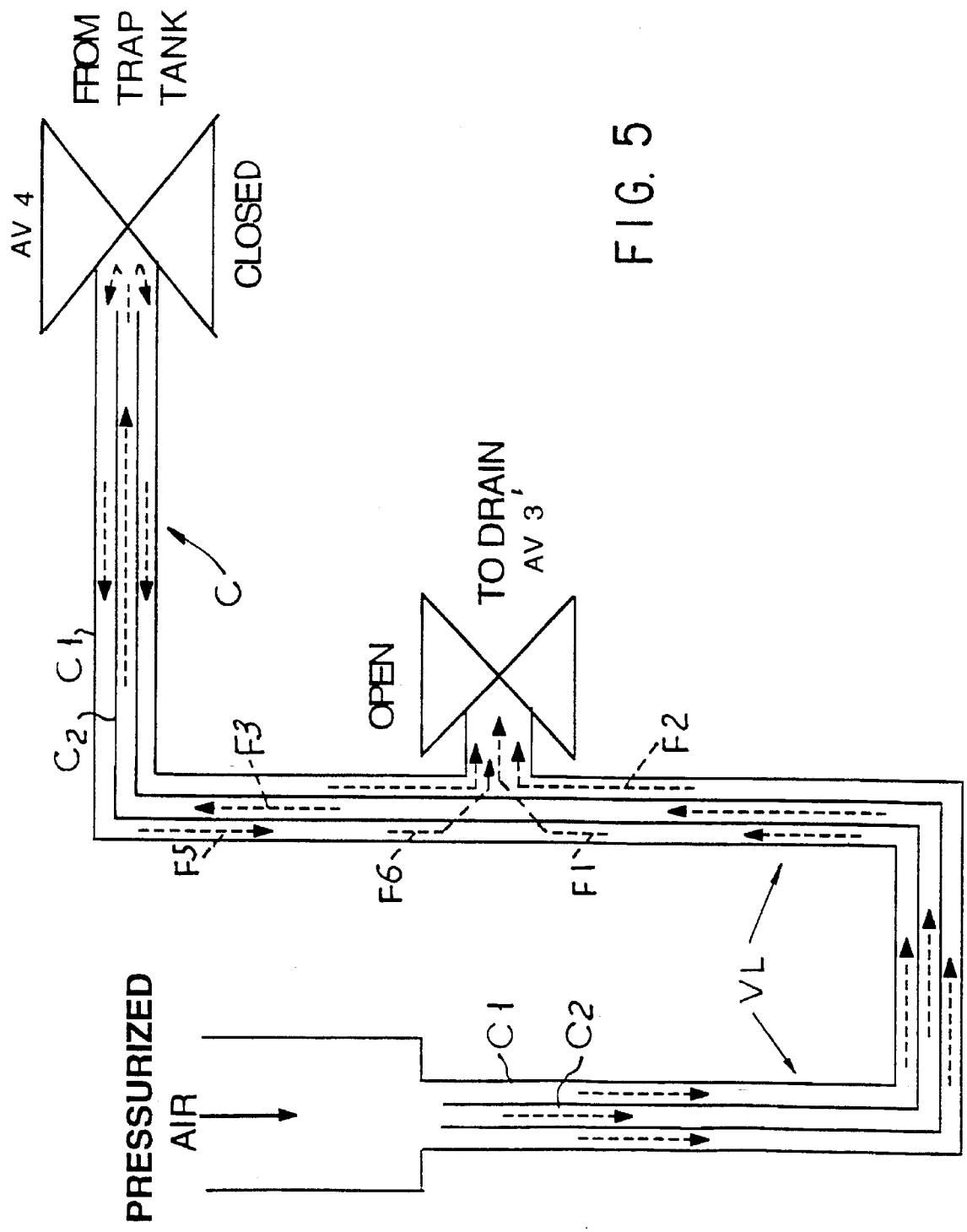

Further aspects of the invention are shown in FIGS. 3–8. As shown in FIGS. 3–5, a double conduit may be employed to interconnect the vacuum chamber, the drain valve AV3', and the trap valve AV4. An outer conduit C1 may have an outside diameter of 4 mm and an inside diameter of 3 mm, for example. An inner conduit may have an outside diameter of 2 mm and an inside diameter of 1.5 mm. These dimensions are of course only examples of usable sets of dimensions. An annular space is defined between the conduits C1 and C2.

As shown in FIG. 4, in the vacuum (air elimination) cycle, resist is drawn from the trap tank and passes through both the outer conduit C1 and the inner conduit C2, to the vacuum chamber, via the conduit C and the line VL. As indicated in FIG. 4, the drain line DL communicates only with the outer conduit C1 and not with the inner conduit C2.

FIG. 5 illustrates the drainage cycle. Pressurized air is pumped from the vacuum chamber back through the line VL, passing through both the outer conduit C1 and the inner conduit C2. Resist in the vacuum chamber and in the annular space between C1 and C2 with the line VL are forced directly into the drain as indicated by arrows F1 and F2 in FIG. 5. However, because the inner conduit C2 does not communicate directly with the drain valve AV3', resist in C2 from the line VL and the vacuum chamber continues past valve AV3' as indicated by arrow F3, and continues to a point close to the trap tank valve AV4, advantageously within 1–2 mm. Because valve AV4 is closed, the resist changes direction as indicated by arrow F5, so as to be pumped back through the outer conduit C1, proceeding then into the drain valve AV3' as indicated by arrow F6.

This arrangement effectively flushes all resist from the conduit C which runs between the trap tank and the junction of the drain line DL and the line VL.

Figure 6:
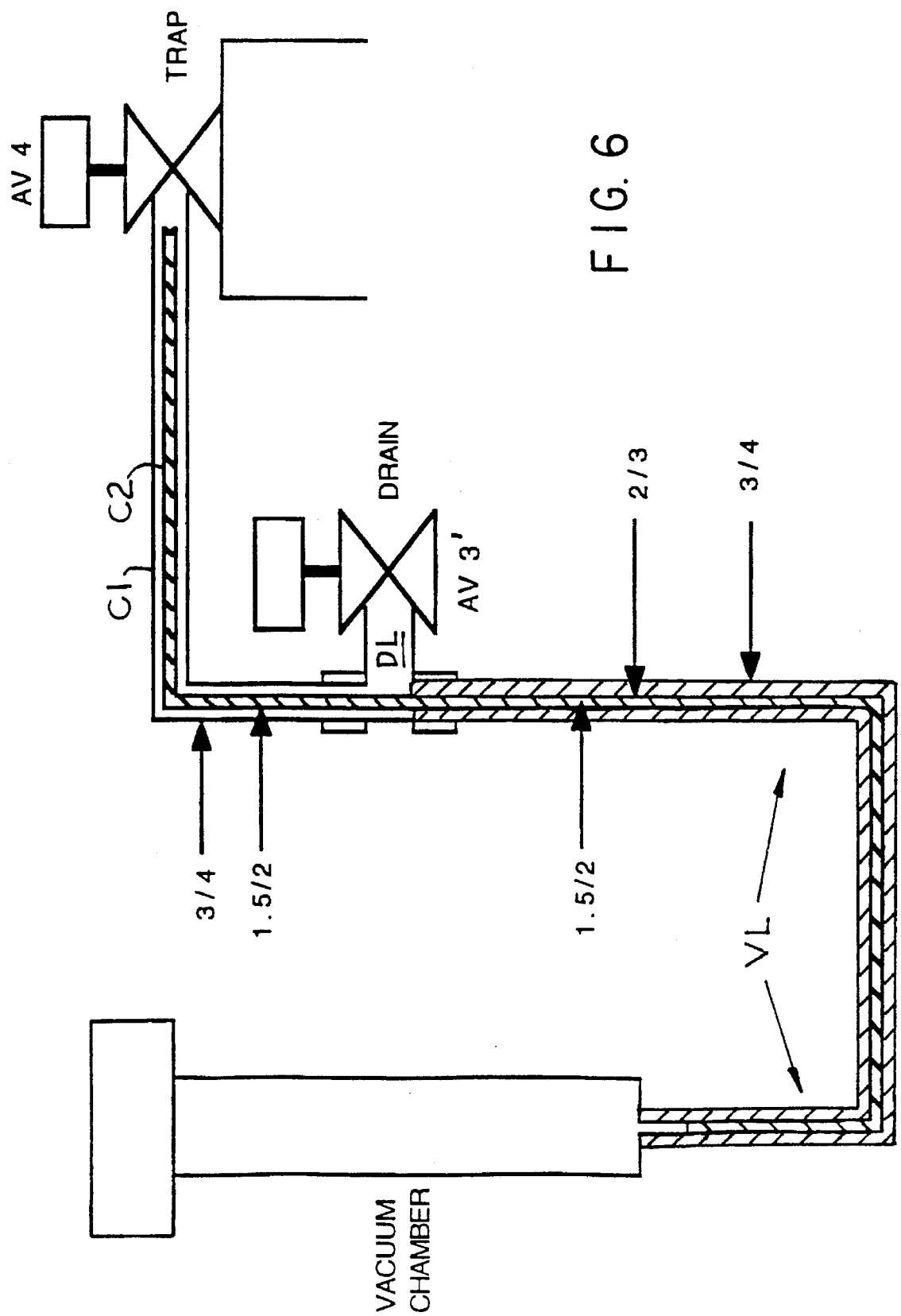
FIGS. 6–8 show another modified conduit arrangement which may be used in the FIG. 2 system.
Figure 7:
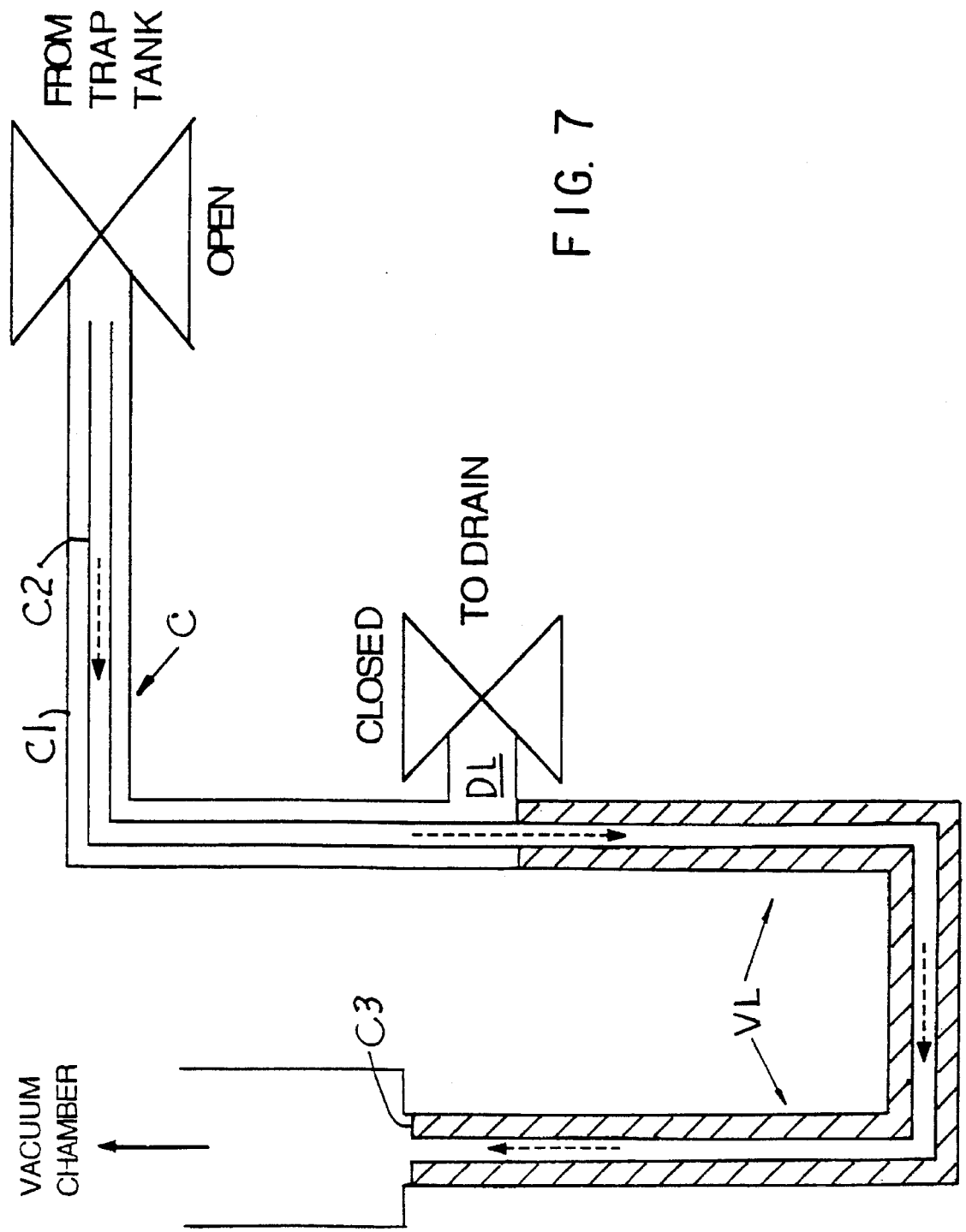
Figure 8:
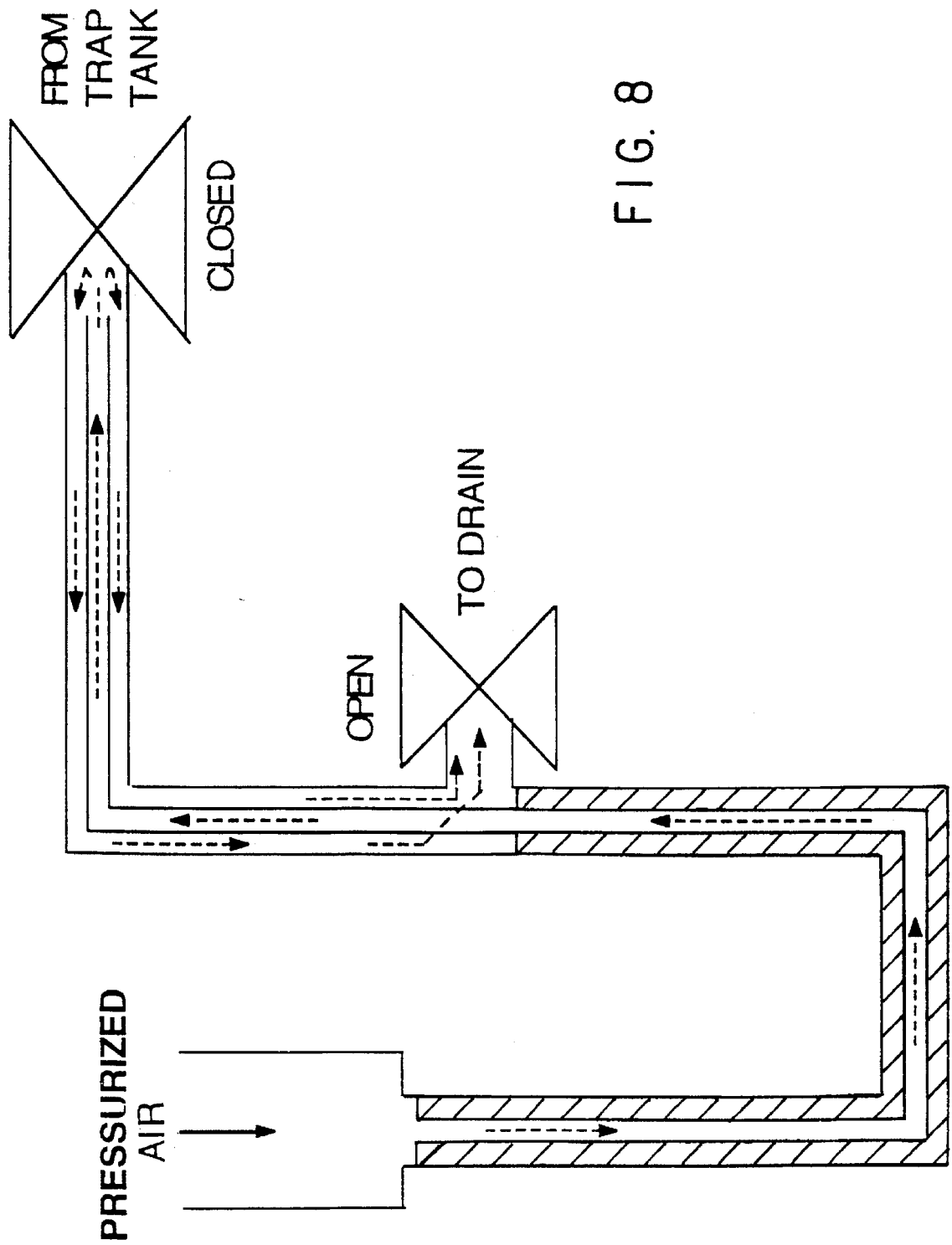

A further modification is shown in FIGS. 6–8. This arrangement has advantages over the arrangement of FIGS. 3–5, particularly during the drainage cycle. The outer conduit C1 and the inner conduit C2 may have the same dimensions as in the embodiment shown in FIGS. 3–5, and may be disposed in the same arrangement. In addition, however, the annular space between the vacuum chamber and the drain line DL is blocked. It is convenient to block this annular space with a third conduit C3, having an outside diameter of 3 mm and an inside diameter of 2 mm, so as to fit tightly in the annular space between the outer conduit C1 and the inner conduit C2. Another suitable blocking material could also be used.

In this arrangement, during the vacuum cycle, as shown in FIG. 7, resist is drawn from the trap tank substantially only through the inner conduit C2, toward the vacuum chamber. The drainage cycle is shown in FIG. 8. During the drainage cycle, pressurized air forces the resist from the vacuum chamber, again substantially only through the inner conduit C2, all the way back to the vicinity of the trap tank valve AV4. Since valve AV4 is closed, the resist then changes direction and continues from the trap tank to the drain through the annular space between the outer conduit C1 and the inner conduit C2. Again in this embodiment, substantially all the residual resist in both conduits is flushed into the drain. Since substantially all of the applied air pressure is directed through the inner conduit C2, and not immediately into the drain valve AV3' as in the embodiment of FIGS. 3–5, highly effective drainage is obtained.

Another feature of the invention relates to the use of an injector with an orifice size of 0.5 mm rather than 1.0 mm as in the Iwaki system. The Iwaki valves are known to open and close improperly from time to time. The present inventor has discovered that those malfunctions are caused by Iwaki's use of the 1.0 mm orifice. The inventor has discovered that for proper valve operation, the pressure on the main air line should be maintained above about 4.0 kg. Although Iwaki specifies a pressure of about 4.5–5.0 kg, the use of the 1.0 mm orifice causes the main pressure to drop by about 0.5 kg. Thus it can fall to below 4.0 kg, causing the malfunctions.

The inventor has discovered that the malfunctions can be avoided by reducing the orifice size to 0.5 mm, which results in less pressure drop. A reduced pressure drop of only about 0.1 kg has been observed. Thus, with the 0.5 mm orifice, a main pressure of 4.4–4.9 kg is maintained.

A further advantage of the smaller orifice is to reduce the speed of flow in the air elimination cycle, so that if there is any residual mist in the system, less will be drawn into the exhaust valve AV1 to cause clogging.

Although the present invention has been described in relation to particular embodiments thereof, many other variations and modifications and other uses will become apparent to those skilled in the art. The present invention is therefore defined not by the specific disclosures herein, but only by the appended claims.

TABLE 1

PRIOR ART IWAKI SEQUENCE

| S1, S2, S3 SENSOR STATUS | AV 1 N/C TO EXH. | AV 2 N/C NOT USED | AV 3 N/O TO DRAIN | AV 4 N/C TRAP TANK | SV 5-AIR INJECTOR | COMMENTS |
|---|---|---|---|---|---|---|
| 1 S1: OFF, S2, S3: ON | ON | OFF | ON | OFF | OFF | STANDBY MODE-NORMAL OPERATION OF RESIST SUPPLY |
| 2 S1, S2: OFF, S3: ON | ON | OFF | ON | ON | ON | AIR ELIMINATION CYCLE-RESIST BEING DRAWN. IF S2 & S1 GO ON WITHIN 30 SEC., SYSTEM GOES BACK TO STANDBY MODE |
| 3 S1, S2: OFF, S3: ON | ON | OFF | ON | ON | ON | T2 TIME PASSED, S2 STILL OFF, CONTROLLER SWITCHES TO THE OTHER BOTTLE, SENDS OUT RESIST EMPTY ALARM (ALARM ONLY) AND CONTINUES TO PULL RESIST FOR T3 TIME. AFTER THAT, IF S2 IS STILL NOT ON, CONTROLLER WILL SEND OUT CHEMICAL REMAIN ALARM (SENDS OUT STOP). |
| 4 S2, S3: ON, S1: OFF | ON | OFF | ON | ON | ON | IF S2 COMES ON WITHIN T3 TIME, SYSTEM KEEPS PULLING RESIST UNTIL S1 COMES ON (APPROX. 10 SEC) |
| 5 S1, S2, S3: ON | ON | OFF | ON | OFF | ON | ONCE S1 IS ON, VACUUM CHAMBER WILL BE PRESSURIZED FOR TIME T1, TO PUSH RESIST OUT THRU DRAIN LINE (DRAIN LINE IS OPEN AT THIS STEP ONLY) |
| 6 S1: OFF, S2, S3: ON | ON | OFF | ON | OFF | OFF | BACK TO STANDBY MODE |

NOTES:
AV 1,4,: NORMALLY CLOSED, AV 3: NORMALLY OPEN
IF S3 IS OFF, CONTROLLER ALSO SENDS OUT CHEMICAL REMAIN ALARM (SENDS OUT STOP)
AV 2 IS NOT USED
DUE TO THE SOLENOID VALVE SV 5 OPEN AT ALL STEPS DURING OPERATION, AIR PRESSURE WILL DROP ABOUT 0.5 KG. TO COMPENSATE THAT PRESSURE LOSS, THE PRESSURE IS SPECIFIED TO BE SET BETWEEN 4.5~5 KG.
CONTROLLER'S TIMER SETTING:
T1: (VACUUM CHAMBER PRESSURIZE TIME)
T2: DELAY TIME FOR PREALARM AND RESIST BOTTLE SWITCH OVER)
T3: RESERVOIR FILL TIME (100~300 SEC)
T4: NOT USED (FILTER AIR VENT)

TABLE 2

IMPROVED SEQUENCE

| S1, S2, S3 SENSOR STATUS | AV 1 N/C TO EXH. | SV 5 N/C AIR TO VENTURI | AV 3 N/C TO DRAIN | AV 4 N/C TRAP TANK | SV 1 N/C PRESSURIZED AIR | COMMENTS: |
|---|---|---|---|---|---|---|
| 1 S1: OFF, S2, S3: ON | OFF | OFF | OFF | OFF | OFF | STANDBY MODE-NORMAL RESIST SUPPLY |
| 2 S1, S2: OFF, S3: ON | ON | ON | OFF | ON | OFF | AIR ELIMINATION CYCLE-RESIST BEING DRAWN. IF S2 & S1 GO ON WITHIN T2 TIME, SYSTEM WILL GO BACK TO STANDBY MODE |
| 3 S1, S2: OFF, S3: ON | ON | ON | OFF | ON | OFF | T2 TIME PASSED, S2 STILL OFF, CONTROLLER SENDS OUT PRE-ALARM, GOES TO NEXT STEP |
| 4 S2, S3: ON, S1: OFF | ON | ON | OFF | ON | OFF | IF S2 COMES ON WITHIN T3 TIME, SYSTEM KEEPS PULLING THE RESIST UNTIL S1 COMES ON |
| 5 S1, S2, S3: ON | OFF | OFF | ON | OFF | ON | ONCE S1 IS ON, VACUUM CHAMBER WILL BE PRESSURIZED FOR T1 TIME TO PUSH RESIST OUT THRU DRAIN LINE |
| 6 S1: OFF, S2, S3: ON | OFF | OFF | OFF | OFF | OFF | BACK TO STANDBY MODE |

NOTES:
AT ALL TIMES (OPERATION OR STANDBY MODE) IF S3 IS OFF, CONTROLLER SHOULD SEND OUT ALARM.
T1: PRESSURIZE TIME
T2: PRE-ALARM
T3: ALARM
T4: NOT USED
SV 4 WILL DRIVE BOTH AV 1 & AV 4

What is claimed is:

1. A photoresist dispensing system comprising:

a trap tank for receiving resist from a resist supply, and for dispensing said resist;

a sensor associated with said trap tank which is operative to detect an excess of gas in said trap tank and to issue a sensor signal in response thereto;

a vacuum generator connected to said trap tank by a vacuum line, said vacuum generator being responsive to said sensor signal; and in response thereto, generating a vacuum on said vacuum line to draw resist from said resist supply so as to fill said trap tank and said vacuum line and thereby eliminate said excess gas from said trap tank;

said vacuum generator comprising:

a Venturi arranged for generating a vacuum on said vacuum line in response to an air flow through said Venturi;

an exhaust valve connected to an outlet on a downstream side of said Venturi for controlling said air flow; and a second vacuum generator downstream from said exhaust valve for drawing air through said exhaust valve and thereby creating said air flow through said Venturi to generate said vacuum on said vacuum line.

2. A system as in claim 1, wherein said second vacuum generator comprises a second Venturi arranged for generating a vacuum to draw air through said exhaust valve.

3. A system as in claim 2, wherein said second Venturi has an 0.5 mm orifice.

4. A system as in claim 3, wherein said second vacuum generator comprises an inlet for receiving pressurized air with a nominal pressure of about 4.5–5.0 kg, and passing said pressurized air through said Venturi for generating said vacuum on said vacuum line;

wherein said nominal pressure is maintained at or above about 4.0 kg while being received by said second Venturi.

5. A system as in claim 1, further comprising a drain line connected for receiving resist and/or gas from said vacuum line, and a drain valve for controlling communication between said drain line and a drain;

said drain valve being normally closed so as to block communication between said drain and said drain line except when energy is applied to open said drain valve; and wherein said Venturi further comprises an inlet on an upstream side thereof for receiving pressurized air from an air source and directing said pressurized air so as to force resist and/or gas back through said vacuum line, said drain line, and said drain valve and into said drain.

6. A system as in claim 5, wherein said trap tank has a trap tank valve which is connected to a junction of said vacuum line and said drain line by a conduit;

said vacuum line and conduit comprising an outer conduit and having within them an inner conduit; an annular space being defined between said inner and outer conduits; said inner conduit running continuously between said vacuum generator and said trap tank; said drain line communicating directly with said annular space but not directly with said inner conduit;

whereby when said trap tank valve is closed, said resist and/or gas forced back through said vacuum line is conducted through said inner conduit to said trap tank valve, and then through said annular space to said drain line, and then to said drain.

7. A system as in claim 6, further comprising blocking material which blocks said annular space between said vacuum generator and said drain line.

8. A system as in claim 7, wherein said blocking material comprises a third conduit which fits tightly in said annular space between said inner and outer conduits.

9. A photoresist dispensing system comprising:

a trap tank for receiving resist from a resist supply, and for dispensing said resist;

a sensor associated with said trap tank which is operative to detect an excess of gas in said trap tank and to issue a sensor signal in response thereto;

a vacuum generator connected to said trap tank by a vacuum line, said vacuum generator being responsive to said sensor signal; and in response thereto, generating a vacuum on said vacuum line to draw resist from said resist supply so as to fill said trap tank and said vacuum line and thereby eliminate said excess gas from said trap tank;

a drain line connected for receiving resist and/or gas from said vacuum line, and a drain valve for controlling communication between said drain line and a drain;

wherein said vacuum generator has an inlet on an upstream side thereof for receiving pressurized air from an air source and directing said pressurized air so as to force resist and/or gas back through said vacuum line, said drain line, and said drain valve and into said drain;

wherein said trap tank has a trap tank valve which is connected to a junction of said vacuum line and said drain line by a conduit;

said vacuum line and conduit comprising an outer conduit and having within them an inner conduit; an annular space being defined between said inner and outer conduits; said inner conduit running continuously between said vacuum generator and said trap tank; said drain line communicating directly with said annular space but not directly with said inner conduit;

whereby when said trap tank valve is closed, said resist and/or gas forced back through said vacuum line is conducted through said inner conduit to said trap tank valve, and then through said annular space to said drain line, and then to said drain.

10. A system as in claim 9, further comprising blocking material which blocks said annular space between said vacuum generator and said drain line.

11. A system as in claim 10, wherein said blocking material comprises a third conduit which fits tightly in said annular space between said inner and outer conduits.

12. A system as in claim 9, wherein said vacuum generator comprises:

a Venturi arranged for generating a vacuum on said vacuum line in response to an air flow through said Venturi;

an exhaust valve connected to an outlet on a downstream side of said Venturi for controlling said air flow; and a second vacuum generator downstream from said exhaust valve for drawing air through said exhaust valve and thereby creating said air flow through said Venturi to generate said vacuum on said vacuum line.

13. A system as in claim 9, wherein said drain valve is normally closed so as to block communication between said drain and said drain line except when energy is applied to open said drain valve.

* * * * *